(12) United States Patent
Lee

(10) Patent No.: US 7,956,394 B2
(45) Date of Patent: Jun. 7, 2011

(54) SEPARATION TYPE UNIT PIXEL HAVING 3D STRUCTURE FOR IMAGE SENSOR

(75) Inventor: Do Young Lee, Kyeung-ki Do (KR)

(73) Assignee: Siliconfile Technologies Inc., Seoul (KR)

( * ) Notice: Subject to any disclaimer, the term of this patent is extended or adjusted under 35 U.S.C. 154(b) by 630 days.

(21) Appl. No.: 11/910,922

(22) PCT Filed: Mar. 29, 2006

(86) PCT No.: PCT/KR2006/001144
§ 371 (c)(1),
(2), (4) Date: Oct. 8, 2007

(87) PCT Pub. No.: WO2006/109937
PCT Pub. Date: Oct. 19, 2006

(65) Prior Publication Data
US 2008/0251823 A1    Oct. 16, 2008

(30) Foreign Application Priority Data
Apr. 13, 2005 (KR) .................... 10-2005-0030568

(51) Int. Cl.
*H01L 31/062* (2006.01)
*H01L 31/113* (2006.01)
(52) U.S. Cl. .................. 257/294; 257/444
(58) Field of Classification Search .......... 257/290–294, 257/431–448, E31.073, E31.127, E27.133
See application file for complete search history.

(56) References Cited

U.S. PATENT DOCUMENTS

| 6,307,243 | B1 * | 10/2001 | Rhodes ................ 257/432 |
| 6,486,522 | B1 | 11/2002 | Bishay et al. | |
| 6,642,081 | B1 | 11/2003 | Patti | |
| 2004/0005729 | A1 | 1/2004 | Abe et al. | |
| 2009/0065824 | A1 * | 3/2009 | Hwang ................ 257/292 |
| 2010/0117178 | A1 * | 5/2010 | Kim ................ 257/432 |

FOREIGN PATENT DOCUMENTS

| JP | 2001-267547 A | 9/2001 |
| JP | 2003-273343 | 9/2003 |
| JP | 2004-304012 A | 10/2004 |
| JP | 2004-304198 A | 10/2004 |
| JP | 2006-191081 A | 7/2007 |
| WO | 03/041174 A1 | 5/2003 |

OTHER PUBLICATIONS

International Search Report for corresponding International Application N. PCT/KR2006/001144 dated Jul. 24, 2006.

* cited by examiner

*Primary Examiner* — Cuong Q Nguyen
(74) *Attorney, Agent, or Firm* — Kile Park Goekjian Reed & McManus PLLC

(57) ABSTRACT

A separation type unit pixel having a 3D structure for an image sensor, composed of a plurality of transistors, includes: a first wafer which includes a photodiode, a transfer transistor, a node of a floating diffusion area functioning as static electricity for converting electric charge into a voltage, and a pad connecting the floating diffusion area and the transfer transistor to an external circuit, respectively; a second wafer which includes the rest of the circuit elements constituting a pixel (i.e., a reset transistor, a source-follower transistor, and a blocking switch transistor), a read-out circuit, a vertical/horizontal decoder, a correlated double sampling (CDS) circuit which involves in a sensor operation and an image quality, an analog circuit, an analog-digital converter (ADC), a digital circuit, and a pad connecting each pixel; and a connecting means which connects the pad of the first wafer and the pad of the second wafer.

5 Claims, 6 Drawing Sheets

[Fig. 1]
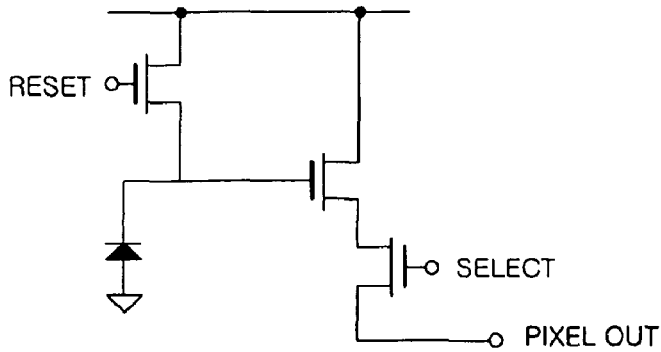
[Fig. 2]
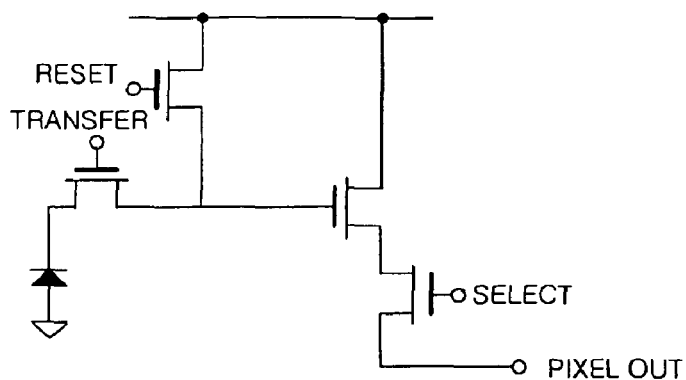
[Fig. 3]
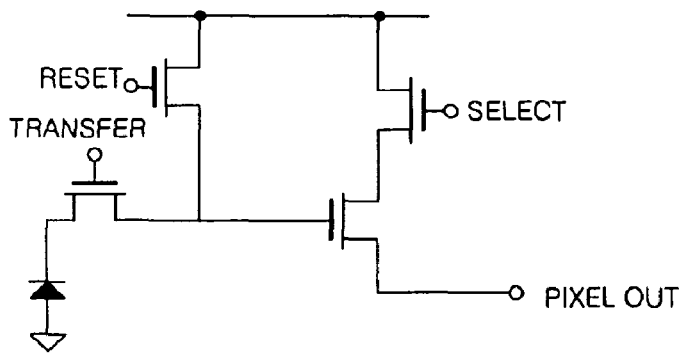
[Fig. 4]
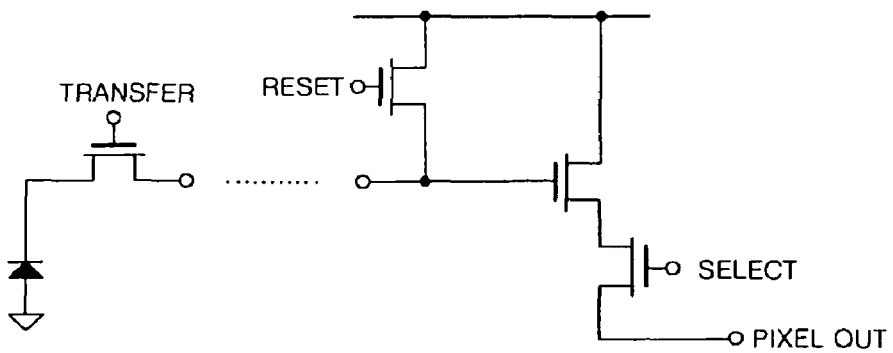

[Fig. 5]
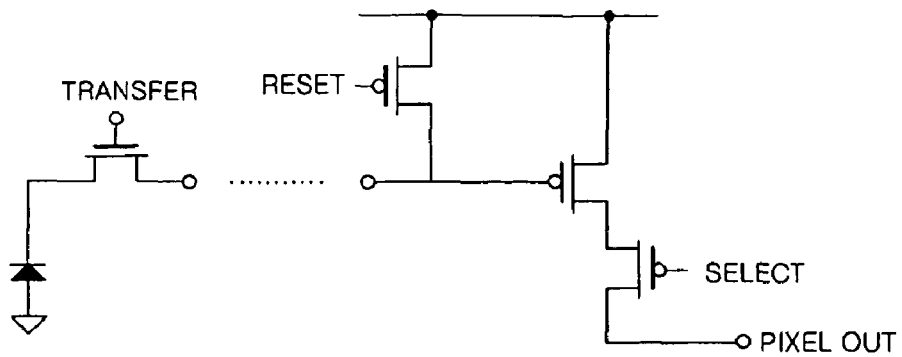
[Fig. 6]
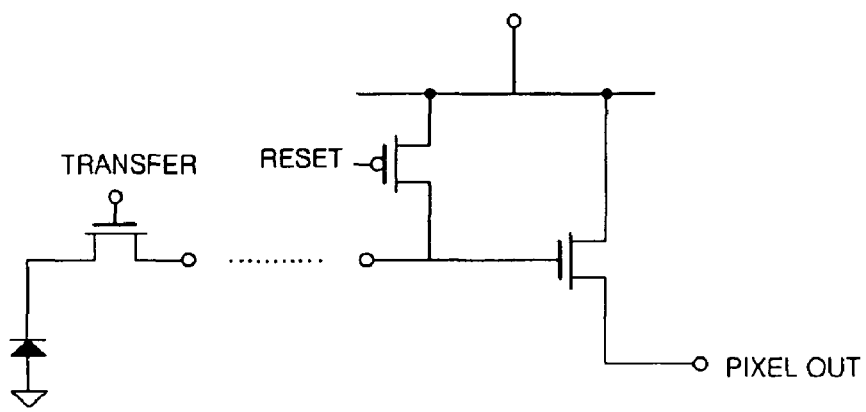
[Fig. 7]
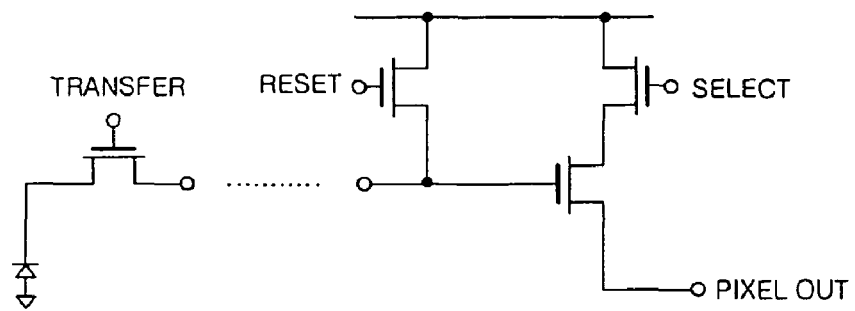
[Fig. 8]
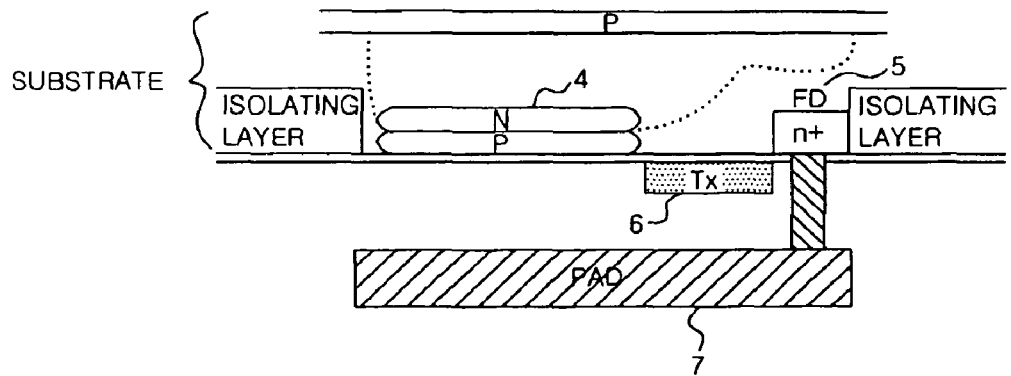

[Fig. 9]
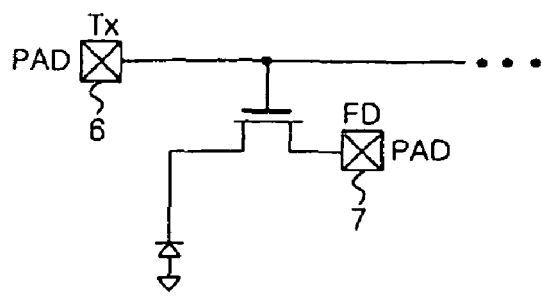
[Fig. 10]
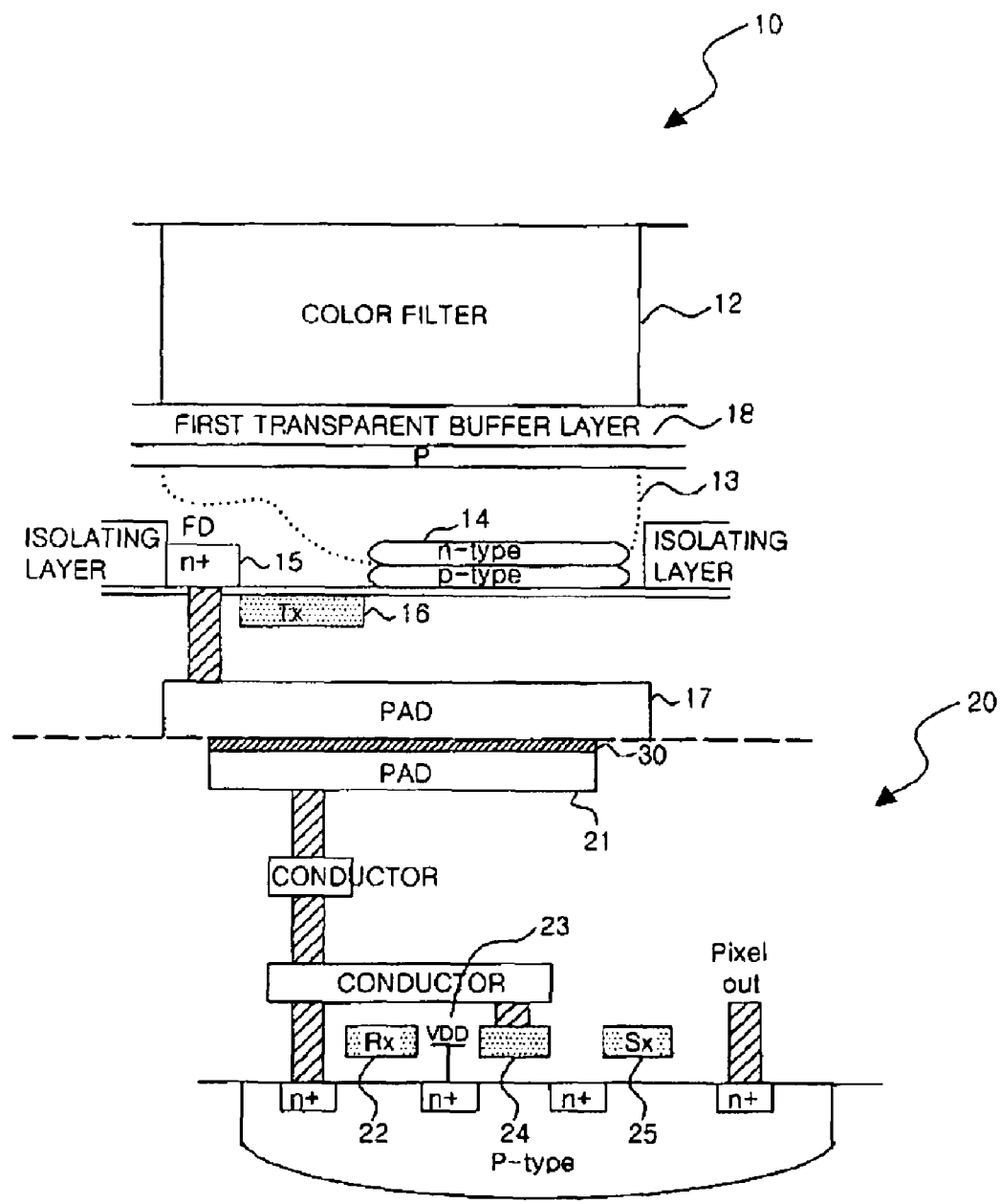

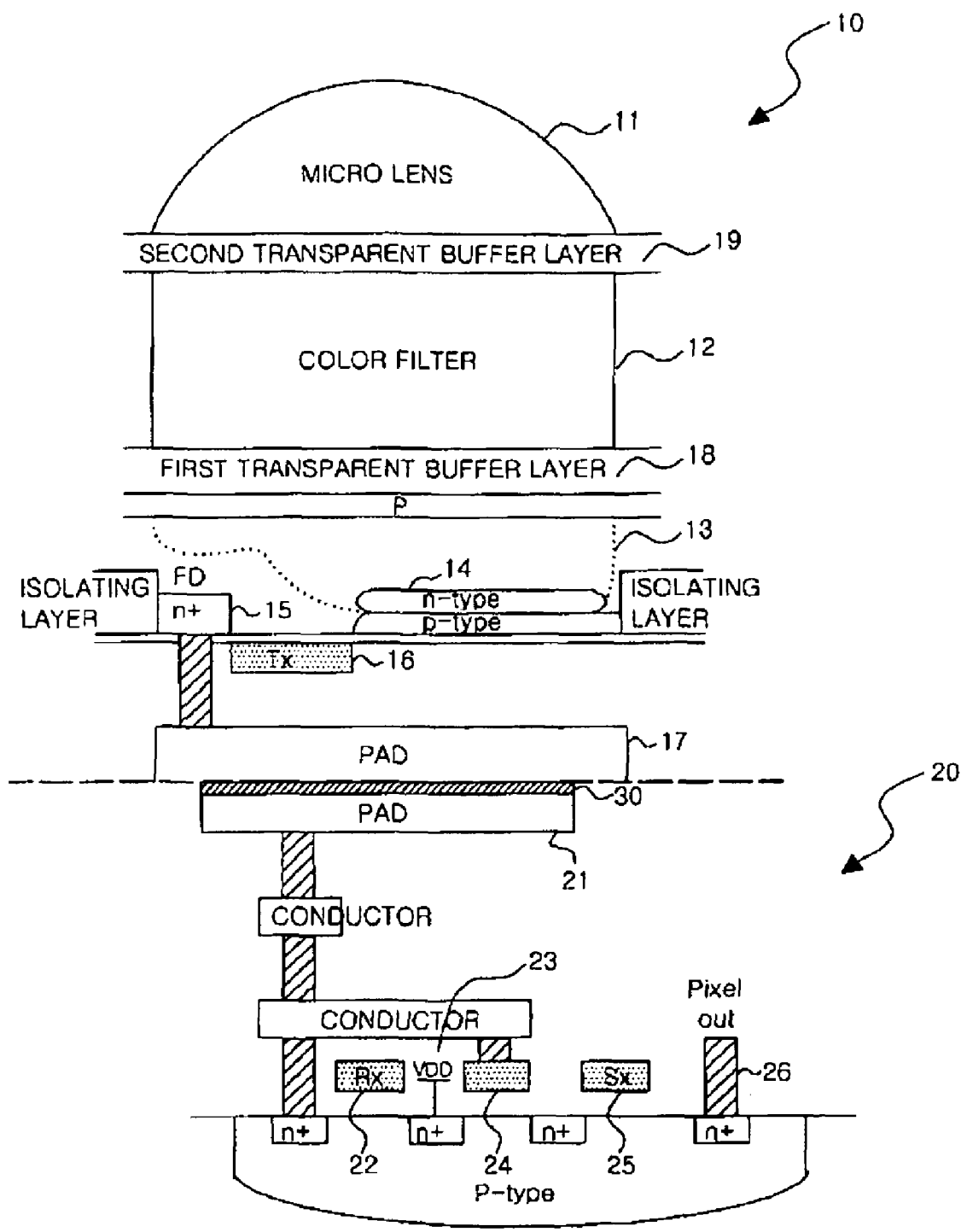

[Fig. 12]
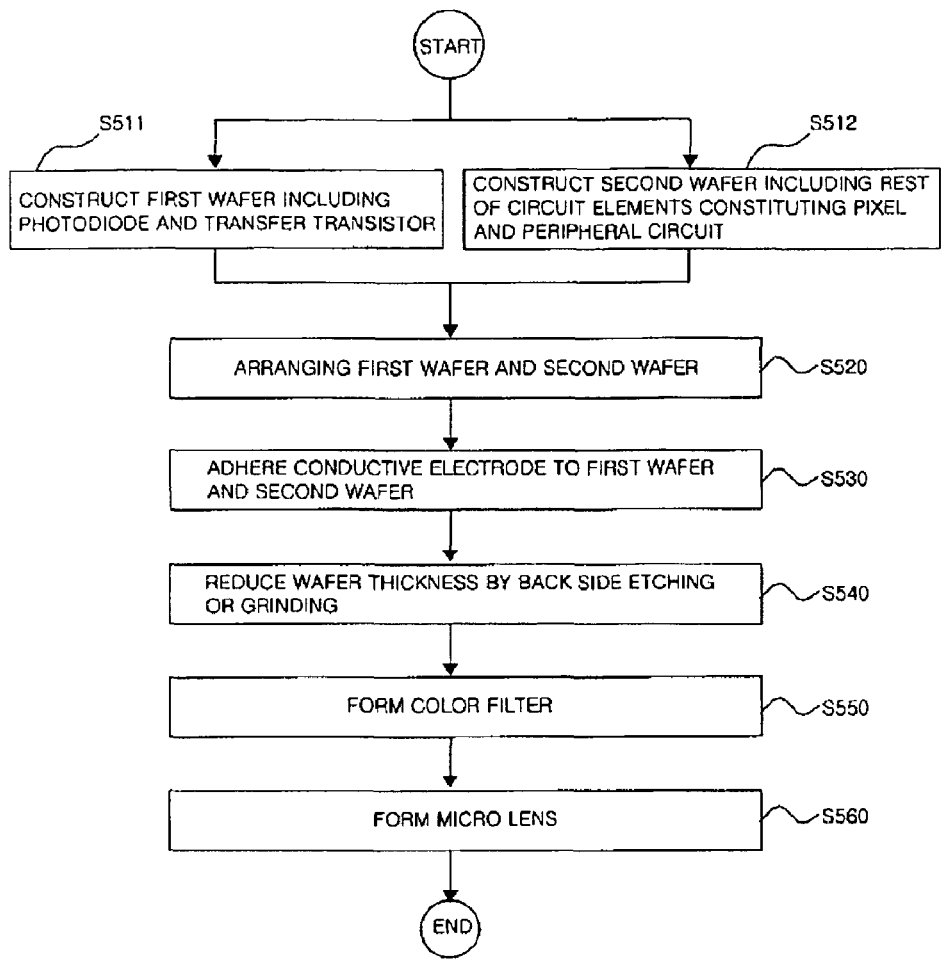
[Fig. 13]
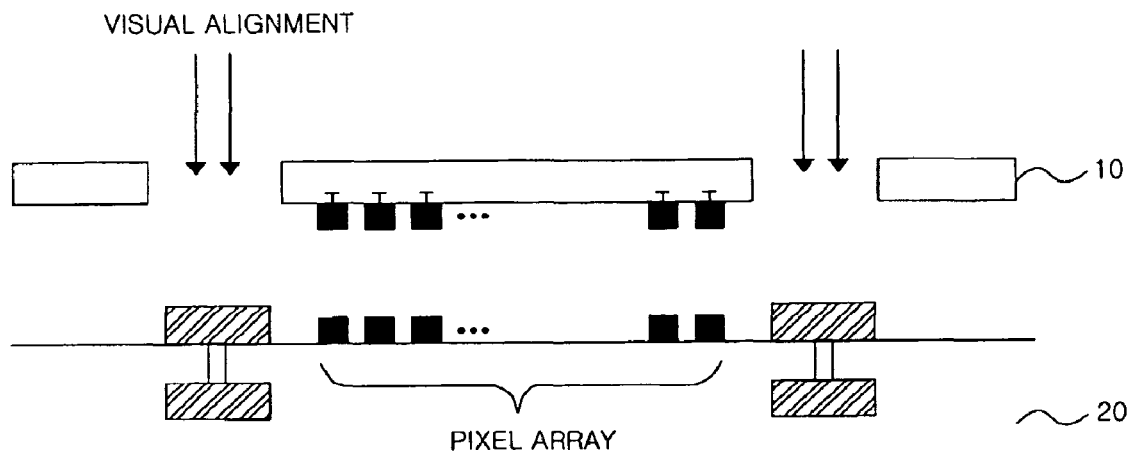

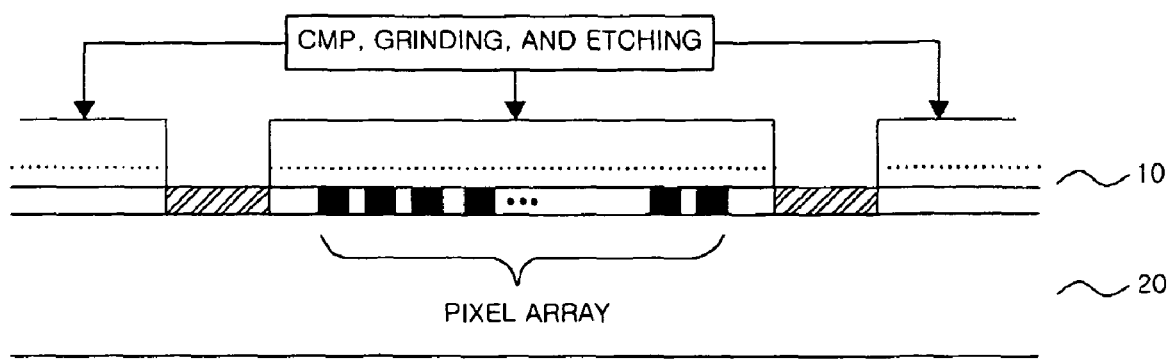
[Fig. 14]

SEPARATION TYPE UNIT PIXEL HAVING 3D STRUCTURE FOR IMAGE SENSOR

TECHNICAL FIELD

The present invention relates to a unit pixel of an image sensor, and more particularly, to a unit pixel of an image sensor having one transistor and one photodiode.

BACKGROUND ART

Pixels used in conventional image sensors are roughly classified into 3-transistor pixels, 4-transistor pixels, and 5-transistor pixels, according to the number of transistors included therein.

FIG. 1 to 3 show a typical pixel structure used in an image sensor, according to the number of transistors.

FIG. 1 shows a structure of a 3-transistor pixel. FIGS. 2 and 3 show a structure of a 4-transistor pixel.

Due to the existence of transistors in a pixel circuit, as shown in FIG. 1 to 3, a fill factor of a photodiode, that is an area for the photodiode with respect to a pixel size, is naturally reduced. In general, the fill factor ranges from 20 to 45%, considering capability of each semiconductor manufacturing process. Light that is incident onto the rest area of 55~80% of the pixel is therefore lost. To minimize the loss of optical data, a subminiature lens is used for each unit pixel in a manufacturing process of an image sensor, so that the optical data can be condensed onto the photodiode of each pixel. A micro lens gain is defined as an increment of the sensitivity of a sensor using a micro lens with respect to the sensitivity of an image sensor without using the micro lens.

Given that the fill factor of a common diode is about 30-something percent, the micro lens gain is about 2.5~2.8 times of gain. However, since a pixel size has decreased to 4 $\mu m \times 4$ $\mu m$, and even to 3 $\mu m \times 3$ $\mu m$. Further, with an emergence of a small-sized pixel of 2.8 $\mu m \times 2.8$ $\mu m$ or 2.5 $\mu m \times 2.5$ $\mu m$, starting from when the pixel size is 3.4 $\mu m \times 3.4$ $\mu m$, the micro lens gain significantly drops from 2.8 times to 1.2 times of gain. This is caused by a diffraction phenomenon of the micro lens. The level of the diffraction phenomenon is determined by a function of a pixel size and position of the micro lens.

However, as the pixel size gradually decreases, the diffraction phenomenon of the micro lens becomes more severe, thereby dropping the micro lens gain less than 1.2 times of gain, which results in a phenomenon where the light condensation seems to be unavailable. This is newly being recognized as a cause of sensitivity deterioration.

In general, the decrease of the pixel size for the image sensor results in the decrease of the area for the photodiode. The area for the photodiode is normally closely related to the amount of available electric charge. For this reason, the amount of the available electric charge decreases when the size of the photodiode decreases. The amount of available electric charge of the photodiode is a basic feature of determining a dynamic range of the image sensor, and the decrease of the amount of available electric charge directly affects the image quality of the sensor. When the image sensor of which pixel size is less than 3.2 $\mu m \times 3.2$ $\mu m$ is manufactured, its sensitivity decreases, and the dynamic range of the sensor with respect to light also decreases, thereby deteriorating the image quality.

An external lens is used in the process of manufacturing a camera module using the image sensor. In this case, light is substantially vertically incident onto a center portion of a pixel array. However, the light is less vertically incident onto edge portions of the pixel array. When an angle starts to deviate from the vertical angle by a predetermined degree, the light is condensed onto the micro lens which is out of the area, pre-assigned for condensation, for the photodiode. This causes a dark image, and more seriously, when the light is condensed onto a photodiode of an adjacent pixel, chromaticity may change.

Recently, with the development of the image sensor having from 0.3 million pixels and 1.3 million pixel to 2 million pixels and 3 million pixels, a dynamic zoom-in/zoom-out function as well as an automatic focus function are expected to be included in a mini camera module.

The feature of the functions lie in that the incident angle of the light significantly changes at edge portions while each function is performed. The chromaticity or brightness of the sensor has to be independent of changes in the incident angle. With the decrease of the pixel size, however, the sensor cannot cope with the changes in the incident angle. At present, the sensor can handle the automatic focus function, but the dynamic zoom-in/zoom-out function is not available yet. Therefore, it is difficult to develop a mini camera module providing a zoom function.

DISCLOSURE OF INVENTION

Technical Problem

In order to solve the aforementioned problems, an object of the present invention is to provide a separation type unit pixel of an image sensor of which sensitivity drops far lesser than a conventional case in the manufacturing of a miniature pixel, capable of handling light that incidents onto a photodiode at various angles, and providing a zoom function in a mini camera module by securing an incident angle margin, and a manufacturing method thereof.

Technical Solution

According to an aspect of the present invention, there is provided a separation type unit pixel having a 3D structure for an image sensor, comprising: a photodiode containing impurities that are opposite type of a semiconductor material; a floating diffusion area which transfers optical electric charge included in the photodiode; a transfer transistor which transfers the optical electric charge generated in the photodiode and is connected to an external circuit; and a pad which connects a node of the floating diffusion area and the transfer transistor to the external circuit, respectively.

According to another aspect of the present invention, there is provided a separation type unit pixel having a 3D structure for an image sensor, composed of a plurality of transistors, comprising: a first wafer which includes a photodiode, a transfer transistor, a node of a floating diffusion area functioning as static electricity for converting electric charge to a voltage, and a pad connecting the floating diffusion area and the transfer transistor to an external circuit, respectively; a second wafer which includes the rest of the circuit elements constituting a pixel (i.e., a reset transistor, a source-follower transistor, and a blocking switch transistor), a read-out circuit, a vertical/horizontal decoder, a correlated double sampling (CDS) circuit which involves in a sensor operation and an image quality, an analog circuit, an analog-digital converter (ADC), a digital circuit, and a pad connecting each pixel; and a connecting means which connects the pad of the first wafer and the pad of the second wafer.

According to another aspect of the present invention, there is provided a manufacturing method of a separation type unit pixel having a plurality of transistors for an image sensor, the method comprising: (a) constructing a first wafer which includes a photodiode, a transfer transistor, and a floating diffusion area functioning as static electricity for converting electric charge to a voltage; (b) constructing a second wafer which includes the rest of the circuit elements constituting a pixel (i.e., a reset transistor, a source-follower transistor, and a blocking switch transistor), a read-out circuit, a vertical/horizontal decoder, a CDS circuit which involves in a sensor operation and an image quality, an analog circuit, an ADC, and a digital circuit; (c) arranging the first wafer and the second wafer up and down for pixel array arrangement; (d) adhering a pad of a unit pixel on the first and second wafers arranged up and down; (e) performing surface processing for making the back side of the first wafer thin to reduce the thickness of the first wafer; and (f) forming a color filter on the first wafer.

DESCRIPTION OF DRAWINGS

FIG. 1 to 3 show circuit diagrams of a conventional pixel structure of an image sensor;

FIG. 4 to 7 show circuit diagrams of a separation type unit pixel of an image sensor according to an embodiment of the present invention;

FIG. 8 shows a physical structure of a separation type unit pixel of an image sensor according to an embodiment of the present invention, illustrating a physical structure of a portion where a photodiode and a transfer transistor are connected;

FIG. 9 shows a circuit diagram of the separation type unit pixel of the image sensor of FIG. 8;

FIG. 10 shows a physical structure of a separation type unit pixel having a 3D structure for an image sensor according to an embodiment of the present invention;

FIG. 11 shows a physical structure of a separation type unit pixel having a 3D structure for an image sensor according to another embodiment of the present invention;

FIG. 12 is a flowchart of a manufacturing method of a separation type unit pixel having a 3D structure for an image sensor according to an embodiment of the present invention;

FIG. 13 shows how a first wafer and a second wafer are arranged when manufacturing a separation type unit pixel having a 3D structure for an image sensor, according to an embodiment of the present invention; and FIG. 14 shows a process of reducing the surface thickness of the back side of a first wafer when manufacturing a separation type unit pixel having a 3D structure for an image sensor according to an embodiment of the present invention.

BEST MODE

Hereinafter, the present invention will be described in detail with reference to accompanying drawings.

FIGS. 4 to 7 are circuit diagrams illustrating a unit pixel structure of an image sensor according to an embodiment of the present invention.

A portion where a photodiode and a transfer transistor are connected is separated from a portion where a reset transistor, a source-follower transistor, and a select transistor are connected. The transistors may be N-type or P-type transistors.

FIG. 8 shows a physical structure of a separation type unit pixel of an image sensor according to an embodiment of the present invention. The depicted physical structure is a portion where a photodiode and a transfer transistor are connected.

A photodiode 4 has a P-type semiconductor structure. A floating diffusion area 5 transfers electric charge included in the photodiode 4, and contains impurities of the same type of the photodiode 4. A transfer transistor 6 connects and separates the floating diffusion area 5 and the photodiode 4. A pad 7 connects the floating diffusion area 5 to an external circuit.

FIG. 9 shows a circuit diagram of the separation type unit pixel of the image sensor of FIG. 8.

As shown in FIG. 9, external connection pads PAD are provided to connect a plurality of separation type unit pixels of the image sensor.

The external connection pads PAD are provided at a floating diffusion node FD and a source of the transfer transistor 6.

FIG. 10 shows a separation type unit pixel having a 3D structure for an image sensor according to an embodiment of the present invention. The separation type unit pixel includes a first wafer 10 and a second wafer 20.

The first wafer 10 includes a color filter, a photodiode, a transistor, a floating diffusion area which functions as static electricity for converting electric charge into a voltage, and a pad.

The second wafer 20 includes the rest of the circuit elements constituting a pixel (i.e., a reset transistor, a source-follower transistor, and a blocking switch transistor), a read-out circuit, a vertical/horizontal decoder, a correlated double sampling (CDS) circuit which involves in a sensor operation and an image quality, an analog circuit, an analog-digital converter (ADC), and a digital circuit.

Conductive pads 17 and 21 are respectively connected to the first wafer 10 and the second wafer 20 for external connection.

The first wafer 10 will now be described in detail.

The first wafer 10 includes a color filter 12 which allows each pixel to represent a specific color, a semiconductor material 13 which contains a specific impurity to form a photodiode 14, a first transparent buffer layer 18 which is inserted between the color filer 12 and the semiconductor material 13 to facilitate the formation of structures and to improve light transmission, the photodiode 14 which contains impurities that are opposite type of the semiconductor material 13, a floating diffusion area 15 to which electric charge included in the photodiode 14 is transferred and which contains impurities that are the same type of the photodiode 14, and a transfer transistor 16 which connects and separates the floating diffusion area 15 and the photodiode 14.

In the present invention, the floating diffusion area 15 connected to the external circuit is connected to the conductive pad 17. In addition, a micro pad PAD is formed on an electrode through which the transfer transistor 16 is connected to the external circuit.

The second wafer 20 will now be described in detail.

The second wafer 20 has a pixel array portion and a peripheral circuit portion. The peripheral circuit portion has a typical image sensor structure, and may include a circuit for extracting an image sensor signal, a CDS circuit, a circuit for processing a common analog signal, a digital control circuit, and an image signal processing digital circuit.

In the pixel array portion, pixel elements excluding a photodiode, or a transfer switch along with the photodiode, are regularly arranged, for example, the lower part shown in FIG. 10. A conductive pad 21 receives a signal from the first wafer 10 shown in the upper part A reset transistor 22 and a voltage supplier 23 initialize the photodiode 14. A source-follower transistor 24 transfers a voltage of a floating diffusion area 15, which is a floating node, to the external circuit. A select transistor 25 determines whether to allow given pixel information to be transferred to an external lead-out circuit An electrode 26 is a last output electrode of the pixel.

FIG. 11 shows a separation type unit pixel having a 3D structure for an image sensor according to another embodiment of the present invention.

In comparison with FIG. 10, FIG. 11 further includes a micro lens 11 which collects light to be condensed onto the photodiode 14, and a second transparent buffer layer 19 which is inserted in the middle to facilitate the formation of structures and to improve light transmission. The second transparent buffer layer 19 is used additionally, and is a film used in a general image sensor.

FIG. 12 is a flowchart of a manufacturing method of a separation type unit pixel having a 3 D structure for an image sensor according to an embodiment of the present invention.

First, a first wafer is constructed such that the first wafer includes a photodiode, a transfer transistor, and a floating diffusion area functioning as a static electricity for converting electric charge into a voltage (operation S511).

While constructing the first wafer, a second wafer is constructed so that the second wafer includes the rest of the circuit elements constituting a pixel (i.e., a reset transistor, a source-follower transistor, and a blocking switch transistor), a read-out circuit, a vertical/horizontal decoder, a correlated double sampling (CDS) circuit which involves in a sensor operation and an image quality, an analog circuit, an analog-digital converter (ADC), and a digital circuit (operation S512).

Second, the first wafer and the second wafer are arranged up and down (operation S530).

To arrange the first wafer and the second wafer up and down, the wafers may be arranged in an optical manner by making a hole in the first wafer by using an infrared ray (IR) penetrating method, an etching method, or a laser punching method.

In the IR penetrating method, the wafers are disposed without having to make a hole in the first wafer. In the etching method or the laser punching method, a hole is formed through the first wafer, and then the wafers are arranged through optical pattern recognition.

Third, the first and second wafers arranged up and down are adhered to a conductive pad (operation S530).

Fourth, the surface thickness of the back side of the first wafer is reduced to form thin back side of the first wafer (operation S540).

After the first wafer is adhered to the second wafer, the back side of the first wafer is thinned to reduce the wafer thickness. In order to reduce the thickness of the back side of the first wafer, the back side of the wafer is processed by a grinding process, a chemical mechanical polishing (CMP) process, or an etching process performed on the back side surface of the wafer.

Fifth, a color filter is formed on the first wafer (operation S550).

Sixth, a micro lens is formed on the color filter (operation S560).

FIG. 13 shows an arrangement of the first and second wafers when manufacturing a separation type unit pixel having a 3D structure for an image sensor, according to an embodiment of the present invention.

The first wafer 10 and the second wafer 20 are accurately aligned by using the IR penetrating method, the etching method, or the laser punching method.

In FIG. 13, a hole is formed through the first wafer 10 by using the etching method or the laser punching method.

The hole is not formed through the first wafer when using the IR penetrating method.

FIG. 14 shows a process of reducing the surface thickness of the back side of the first wafer when manufacturing a separation type unit pixel having a 3D structure for an image sensor according to an embodiment of the present invention.

The thickness reducing process is performed by using the CMP method, the grinding method, or the etching method. The thickness of the back side of the first wafer 10 may be reduced by using one of these methods.

The manufacturing method of a separation type unit pixel having a 3D structure for an image sensor of the present invention is not limited to a CMOS manufacturing process, and the method may be used in other semiconductor manufacturing processes.

While the present invention has been particularly shown and described with reference to exemplary embodiments thereof, it will be understood by those skilled in the art that various changes in form and details may be made therein without departing from the spirit and scope of the invention as defined by the appended claims.

INDUSTRIAL APPLICABILITY

Accordingly, the present invention has advantages in that, by forming an area for a photodiode and an area for a pixel almost the same, an image sensor can be manufactured to have a good sensitivity in a subminiature pixel, without having to use a micro lens. In addition, by disposing the photodiode at the top layer, an incident angle margin of incident light can be secured, which has to be basically provided by the sensor for its auto focusing function or zoom function.

The invention claimed is:

1. A separation type unit pixel having a 3D structure for an image sensor, composed of a plurality of transistors, comprising:
    a first wafer which includes a photodiode, a transfer transistor, a node of a floating diffusion area functioning as static electricity for converting electric charge into a voltage, and a pad connecting the floating diffusion area and the transfer transistor to an external circuit, respectively;
    a second wafer which includes the rest of the circuit elements constituting a pixel, a read-out circuit, a vertical/horizontal decoder, a correlated double sampling (CDS) circuit which involves in a sensor operation and an image quality, an analog circuit, an analog-digital converter (ADC), a digital circuit, and a pad connecting each pixel; and
    a connecting means which connects the pad of the first wafer and the pad of the second wafer.

2. The separation type unit pixel of claim 1, wherein the first wafer comprises:
    a semiconductor material which contains a specific impurity for forming a photodiode;
    a first transparent buffer layer which is inserted between the color filer and the semiconductor material to facilitate the formation of structures and to improve light transmission;
    a photodiode which contains impurities that are opposite type of the semiconductor material;
    a floating diffusion area to which optical electric charge included in the photodiode 14 is transferred;
    a transfer transistor which transfers the optical electric charge generated in the photodiode to the floating diffusion are; and
    a pad which connects a node of the floating diffusion to an external circuit.

3. The separation type unit pixel of claim 2, wherein the first wafer further comprises:
- a color filter which allows each pixel to represent a specific color;
- a micro lens which collects light to be condensed onto the photodiode; and
- a second transparent buffer layer which is inserted between the micro lens and the color filer to facilitate the formation of structures and to improve light transmission.

4. The separation type unit pixel of claim 1, wherein the second wafer comprises:
- a pixel array portion in which pixel elements are regularly arranged except for the photodiode and the transfer transistor; and
- a peripheral circuit portion which excludes the pixel array area and has an image sensor structure.

5. The separation type unit pixel of claim 4, wherein the peripheral circuit portion comprises a circuit for extracting an image sensor signal, a CDS circuit, a circuit for processing a common analog signal, a digital control circuit, and an image signal processing digital circuit.

* * * * *